April 14, 1959 T. E. WOHR 2,882,424

RING CIRCUIT

Filed Sept. 30, 1954 2 Sheets-Sheet 1

INVENTOR.

T. E. WOHR

BY P. E. Henninger

ATTORNEY

April 14, 1959 T. E. WOHR 2,882,424

RING CIRCUIT

Filed Sept. 30, 1954 2 Sheets-Sheet 2

INVENTOR.

T. E. WOHR

BY P. E. Henninger

ATTORNEY

United States Patent Office 2,882,424

Patented Apr. 14, 1959

2,882,424

RING CIRCUIT

Thomas E. Wohr, Fishkill, N.Y., assignor to International Business Machines Corporation, New York, N.Y., a corporation of New York Application September 30, 1954, Serial No. 459,471

5 Claims. (Cl. 307—88.5)

This invention relates to ring circuits, and especially to ring circuits employing transistors as translating devices.

A ring circuit, sometimes called a commutator circuit, comprises a plurality of stages connected in cascade, each stage typically being a trigger circuit which is switched between an Off condition and an On condition. Only one of the stages is in the On condition at any given time. A signal received at the input terminals of the ring circuit causes the stage which is On to switch Off and the next succeeding stage to switch On. Typically, the ring is closed, i.e., the last stage in the ring is connected to the first stage so that the first stage switches On when the last one switches Off, although the ring may be open.

Ring circuits are used for several different purposes in high speed computers. They may be used as counting circuits, to count input pulses and to produce an output pulse whenever the ring is completed. Alternatively, a ring circuit is sometimes used to establish a timing cycle, i.e., to set up a cycle consisting of any desired number of intervals, which cycle may be repeated as desired, the intervals being used to establish the timing of a number of control functions.

In ring circuits, it is desirable that the switching between stages take place rapidly, since the switching represents wasted time as far as the functioning of the ring is concerned.

Ring circuits of the prior art have typically used vacuum tubes as translating devices. It is desirable to provide a ring circuit using junction transistors rather than vacuum tubes, because of the lower power and voltage requirements of such transistors and because of their longer life. However, transistor ring circuits heretofore proposed have been objectionable because of the longer switching time required between stages as compared to vacuum tubes.

An object of the present invention is to provide an improved ring circuit of the type described.

Another object is to provide a ring circuit having a faster switching time between stages.

Another object is to provide an improved transistor ring circuit.

The foregoing objects are attained in the ring circuit described herein by providing, for each stage of the ring circuit, a trigger circuit employing two junction transistors, each having its output electrode cross-coupled to the other input electrode. One transistor in each stage is On while the other is Off, the Off transistor being effective to hold the other transistor On through the cross-coupling.

The ring disclosed is of the Leslie type, in which separate inputs are provided for the odd and even stages, the two inputs being alternately fed with signals.

The signals for the ring circuit are supplied through a double ended trigger circuit, i.e., a trigger circuit having two sets of output terminals, one of which is On when the other is Off. One of the trigger outputs feeds the inputs of the odd stages of the ring, and the opposite output of the trigger feeds the even stages of the ring.

The input to each stage is completed through a diode to the output electrode of the transistor which is normally Off. When this transistor is Off, its output electrode is at a potential such that it blocks conduction through the diode. Consequently, only the ring stage which is On at any instant may receive a signal from the ring input.

A double coupling is provided between each pair of successive stages of the ring circuit. The output terminal of each Off transistor is coupled through a capacitor to the input terminal of the Off transistor in the next succeeding stage. This is the primary coupling and is the one which initiates the switching action in the next stage. The output terminal of the On transistor is connected through another capacitor to the input terminal of the On transistor in the next stage. This is a secondary coupling which serves as a follow-up for the primary coupling and hastens the completion of the switching action between stages.

There is connected to the output terminal of the On transistor of each stage a combined clamp and indicator circuit of the type described in detail and claimed in the co-pending application of Joseph C. Logue and Robert A. Henle, Serial No. 459,289, filed September 30, 1954, now U.S. Patent No. 2,772,410, issued November 27, 1956. These indicator circuits operate lamps showing which of the several stages of the ring is on at any given instant.

Other objects and advantages of the invention will become apparent from a consideration of the following specification and claims, taken together with the accompanying drawings.

Figure 1:
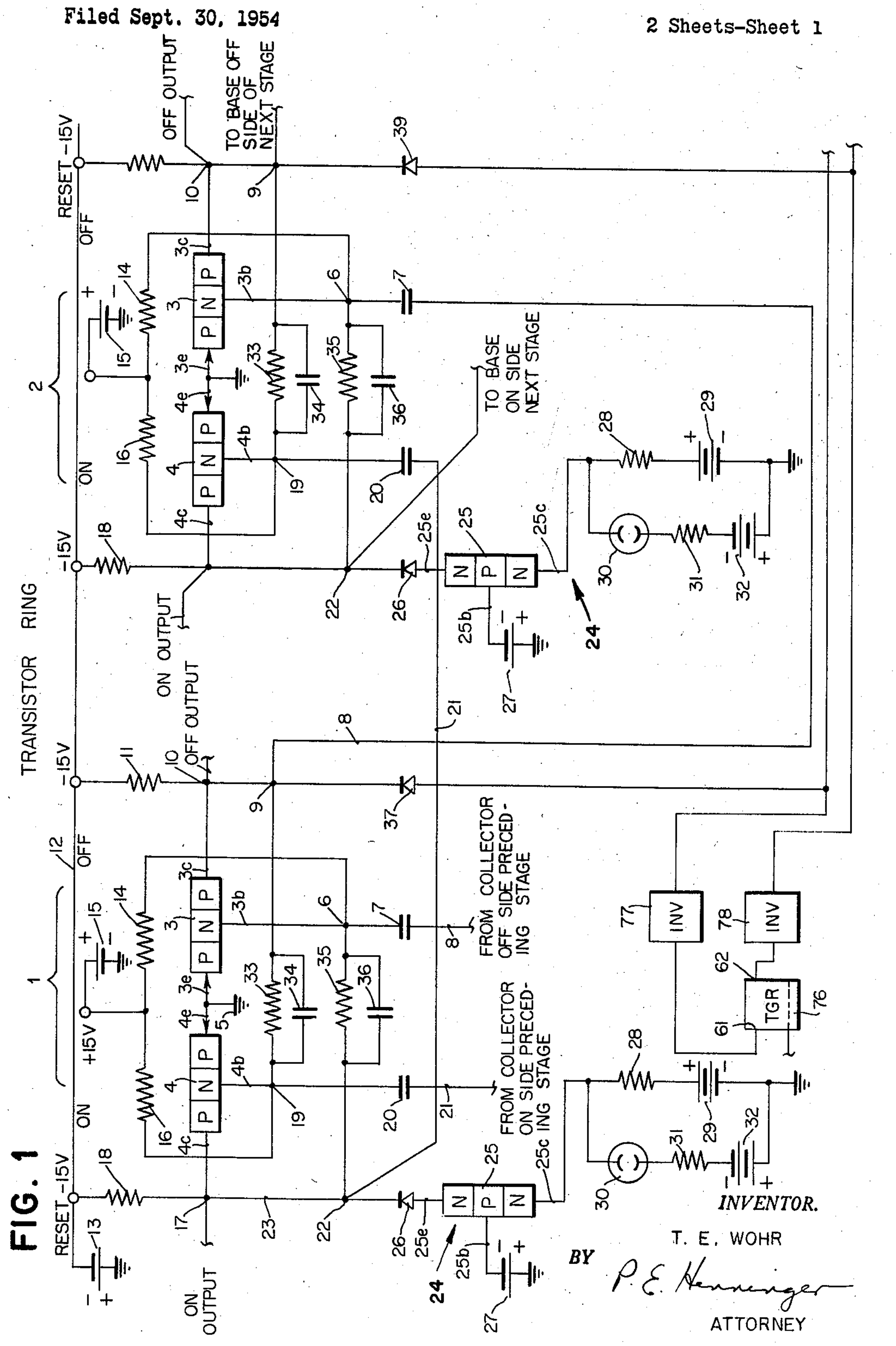
Figure 1 is a wiring diagram of two stages of a ring circut embodying the invention.

Referring to Figure 1, there are shown two stages of a ring circuit, respectively indicated generally by the reference numerals 1 and 2. The complete ring circuit may comprise any even number of stages. Since illustration of additional stages would be repetitious, only two are shown. The two stages comprise equivalent circuit elements which have been given the same reference numerals in both stages.

Stage 1 comprises two junction transistors 3 and 4, having emitter electrodes 3*e* and 4*e*, base electrodes 3*b* and 4*b*, and collector electrodes 3*c* and 4*c*. Transistor 3 is hereinafter referred to as the Off transistor of the stage and transistor 4 is the On transistor. The two emitter electrodes 3*e* and 4*e* are connected to ground at 5. Base electrode 3*b* is connected to an input terminal 6, which is coupled through a capacitor 7 and a wire 8 to an output terminal 9 of the next preceding stage. If stage 1 is the first stage in the ring and the ring is closed, the wire 8 is connected to the output terminal 9 of the last stage in the ring. Collector electrode 3*c* is connected to an Off output terminal 10 and thence through a load resistor 11, a wire 12 and a load battery 13 to ground.

Base electrode 3*b* is also connected through a resistor 14 and a biasing battery 15 to ground. Base electrode 4*b* is similarly connected through a resistor 16 and biasing battery 15 to ground.

Collector electrode 4*c* is connected to an On output terminal 17, and thence through a resistor 18, wire 12 and battery 13 to ground. Base electrode 4*b* is connected to an input terminal 19 and thence through a capacitor 20 and a wire 21 to an output terminal 22 on the last preceding stage. Collector electrode 4*c* is connected through a wire 23 to the output terminal 22 of stage 1.

Also connected to output terminal 22 is a combined clamp and indicator circuit generally indicated by the reference numeral 24. This circuit is described in detail and claimed in the co-pending application of Logue and Henle, previously mentioned. The indicator circuit 24 comprises a NPN transistor 25, having an emitter electrode 25e, a base electrode 25b and a collector electrode 25c. The emitter electrode 25e is connected through a diode 26 to output terminal 22. Base electrode 25b is connected through a biasing battery 27 to ground. Collector electrode 25c is connected through a load resistor 28 and a battery 29 to ground. Also connected in series between collector electrode 25c and ground is a neon glow lamp 30, a resistor 31 and a battery 32.

Collector 3c is cross-coupled to the base 4b through a resistor 33 and a parallel capacitor 34. Collector 4c is similarly cross-coupled to base 3b through a resistor 35 and a parallel capacitor 36.

Signals are supplied to the ring circuit from a driving trigger circuit generally indicated at 76, having two output terminals 61 and 62. Output terminal 61 is connected to an inverter circuit 77, whose output is connected through diodes 37 to the terminals 9 on all the odd numbered stages of the ring. Output terminal 62 of trigger 76 is connected to an inverter 78 whose output is connected through diodes 39 to the terminals 9 of all of the even numbered stages of the ring.

It may be seen that the ring illustrated is of the type described by Leslie in the article entitled "Megacycle Stepping Counter" on pages 1030–34 of the August 1948 issue of the proceedings of the Institute of Radio Engineers, and commonly known as a Leslie ring. Such a ring is characterized by the use of separate alternately transmitting signal inputs for the odd and even stages.

Figure 2:
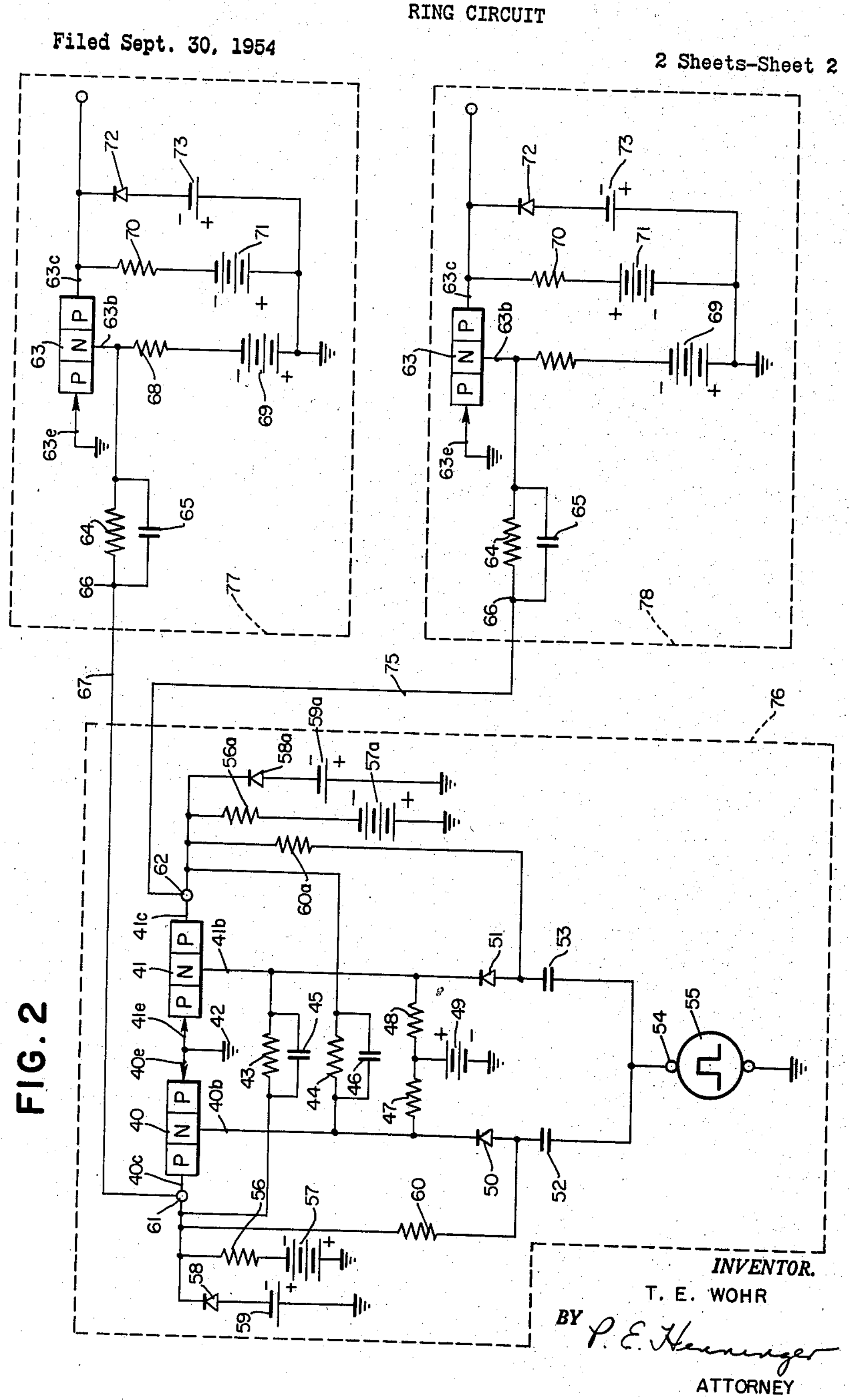
Figure 2 is a wiring diagram of a trigger and inverter circuit which may be utilized to supply signals to the ring circuit of Figure 1.

Any suitable trigger circuit 76 may be utilized and any suitable inverter circuit may be utilized for the inverters 77 and 78. Figure 2 illustrates a suitable trigger circuit, connected to suitable inverter circuits. The trigger circuit illustrated in Figure 2 is shown in detail in the co-pending application of Robert A. Henle, Raymond W. Emery, George D. Bruce, and Olin L. MacSorley, Serial No. 459,381, filed September 30, 1954. The inverter circuit of Figure 2 is shown in the co-pending application of George D. Bruce and Robert A. Henle, Serial No. 459,322, filed September 30, 1954.

The inverter circuits are provided to decrease the load on the trigger circuit and to reshape the signal pulses from the trigger to provide a faster rise time. If a trigger circuit were available giving output pulses under load having a fast rise time at the desired frequency of operation, then the inverters might be omitted.

Other equivalent trigger and inverter circuits may be used if desired.

FIG. 1—OPERATION OF SINGLE STAGE

Since only one of the stages is On at any particular instant, the normal condition of each stage is its Off condition. In the Off condition of a stage, the Off transistor 3 is On and the On transistor 4 is Off. This terminology is somewhat confusing, but it has become conventional in connection with double ended trigger circuits, for example, trigger circuits of the Eccles-Jordan type. It is therefore followed in this specification.

The On transistor 4 being Off, has its collector electrode 4c clamped substantially at the potential of the negative terminal of battery 27 through transistor 25 (now conducting) and diode 26. This potential is applied through the cross-coupling resistor 35 and capacitor 36 to the base electrode 3b of transistor 3, and is there effective to overcome the biasing effect of battery 15 and resistor 14, holding base 3b negative with respect to emitter 3e. Transistor 3 is therefore held On and its collector 3c and output terminal 10 are substantially at ground potential.

Inverter 77, under "no signal" conditions, has a negative potential, for example —5 volts, at its output terminal. Since terminal 9 is at ground potential, at such times diode 37 has a reverse bias potential across its terminals and it does not conduct.

Now assume that a signal is impressed on diode 37. In the present instance, this is accomplished by the inverter circuit 77 shifting to its "signal" condition wherein its output terminal is at ground potential. This is substantially the same potential as terminal 9, so that no positive impulse is transmitted through diode 37 to terminal 9. It may therefore be seen that input signals from the inverters 77 and 78 are not received at the Off stages.

When a stage is On, its transistor 3 is Off and its transistor 4 is On. Collector 3c and terminal 9 are then at their negative potential of —5 volts, and collector 4c is then at ground potential. When an input signal is received from one of the inverters at an On stage, its diode 37 is biased forwardly by the negative potential at collector 3c, so that the positive signal from the inverter carries through diode 37 to terminal 9 and thence through the cross-coupling resistor 33 and capacitor 34 to the base electrode 4b of transistor 4. It is there effective to swing the base 4b positive and turn the transistor 4 Off. Transistor 4 going Off changes the potential of its output terminal 17 in a negative sense, and this negative potential is transmitted through resistor 35 and capacitor 36 to base electrode 3b, where it is effective to turn the transistor 3 On.

INTERSTAGE COUPLING

When an input signal is received at terminal 9 of stage 1 when that stage is On, it is transmitted through wire 8 and capacitor 7 to the input terminal 6 of stage 2, where it is effective to turn transistor 3 Off, thereby producing at output terminal 10 a negative potential which is transmitted through cross-coupling resistor 33 and capacitor 34 to base 4b, turning transistor 4 On.

Initially, the signal transmitted through capacitor 7 is only that supplied by inverter 36. However, as soon as transistor 3 of stage 1 is switched from its Off condition to its On condition, the signal supplied through capacitor 7 is reinforced by the signal due to the positive swing of collector 3c of transistor 3. Also, when transistor 4 of stage 1 turns Off, a negative-going signal is transmitted from output terminal 22 through wire 21 and capacitor 20 to input terminal 19 and base 4b of the stage 2 to turn transistor 4 On. The two signal potentials from the collectors of transistors 3 and 4 in stage 1 reinforce the action of the initial signal in starting the switching of stage 2, and carry the switching to completion rapidly.

While this interstage coupling arrangement is shown in connection with a Leslie type of ring circuit, its utility is not limited to that particular type. On the contrary, this interstage coupling may be used with ring circuits of other types.

INDICATOR CIRCUIT

As described in detail in the Logue and Henle application, Serial No. 459,289, mentioned above, the indicator circuit 24 operates to light the indicator lamp 30 when the stage 1 is in its On condition and to extinguish the lamp 30 when the stage is Off.

It may be seen that the lamp 30 is in a series circuit including batteries 29 and 32 and resistors 28 and 31. The terminal potentials of the two batteries 29 and 32 are such that their sum is greater than the breakdown potential required to start lamp 30 conducting. If the only current in the loop circuit including the lamp were the current taken by the lamp, then the lamp would be continuously illuminated. However the collector current from transistor 25 also flows through resistor 28 and battery 29. When transistor 25 is Off, the collector current is substantially zero, and the indicator lamp 30 is illuminated. When transistor 25 is On, the flow of collector current through resistor 28 creates a sufficient potential drop across that resistor so that the potential available at the lamp 30 falls below the discharge maintaining potential of the lamp, and it is extinguished.

Transistor 25 is turned On and Off in accordance with the condition of stage 1. When stage 1 goes Off, transistor 4 goes Off, and output terminal 17 swings toward the potential of the negative terminal of battery 13. When terminal 17 reaches the potential of base **25*b* of transistor 25, which is the potential of the negative terminal of battery 27, a substantial current flows through the emitter 25*e* and transistor 25 turns On, so that the lamp 30 is extinguished. Collector 4*c* is then clamped at a potential substantially equal to that of the negative terminal of battery 27**.

Conversely, when stage 1 is On, the potential of output terminal 17 is shifted in a positive direction and blocks the flow of current from emitter **25*e*, turning transistor 25 Off and allowing the indicator 30** to be illuminated.

FIG. 2

This figure illustrates an arrangement for supplying driving input pulses for the ring circuit of Fig. 1. The circuit of Fig. 2 includes a trigger circuit 76 and two inverter circuits 77 and 78.

As mentioned above, the trigger circuit 76 is substantially the same as that disclosed in the co-pending application of Robert A. Henle et al., Serial No. 459,381, filed September 30, 1954. It will, therefore, be described only briefly herein. The trigger circuit 76 includes two PNP junction transistors 40 and 41 having emitter electrodes **40*e* and 41*e*, base electrodes 40*b* and 41*b*, and collector electrodes 40*c* and 41*c***.

The emitter electrodes are connected to ground at 42. Each collector electrode is cross-coupled to the other base electrode, resistors 43 and 44 and capacitors 45 and 46 being employed for this purpose. The base electrodes are biased through resistors 47 and 48, by a biasing battery 49.

The base electrodes are also connected to an input terminal 54 through gates comprising, for base **40*b*, a diode 50, a capacitor 52, and a resistor 60 connected to collector 40*c*, and for base 41*b*, a diode 51, a capacitor 53, and a resistor 60*a* connected to collector 41*c*. A square wave signal generator 55 is connected between input terminal 54 and ground. The respective collectors 40*c* and 41*c* are connected to load resistors 56, 56*a* in series with batteries 57, 57*a* and are also connected to clamping means including diodes 58, 58*a*, and batteries 59, 59*a***.

The trigger circuit 76 is provided with output terminals 61 and 62 connected respectively to the collector electrodes **40*c*, 41*c* of the transistors 40 and 41**.

The trigger circuit 76 responds to a series of square wave pulses at its input terminals by alternately turning on the transistor 40 and the transistor 41. When transistor 40 is On, a positive output signal is produced at terminal 61, and when transistor 41 is On, a corresponding positive output signal is produced at terminal 62. As described in the Henle et al., application, Serial No. 459,381, mentioned above, this trigger circuit 76 may, for example, respond to a signal generator 55 which transmits "no signal" potentials of a negative value, e.g., —5 volts, and "signal" potentials of 0 volts. The trigger circuit 76 produces output potentials having the same "no signal" and "signal" values.

The inverter circuits 77 and 78 are the same as those disclosed in the co-pending application of George D. Bruce and Robert A. Henle, Serial No. 459,322, filed September 30, 1954. The inverter circuits will, therefore, be only briefly described herein. Since the circuit elements are the same as in both inverter circuits, only one will be described, the same reference numerals being used for corresponding circuit elements in the other inverter.

Each inverter circuit inverts the signals received at its input. Specifically, each produces an output "signal" potential of 0 volts whenever its input terminal is at —5 volts, and produces a "no signal" potential of —5 volts when its input terminal receives a "signal" potential of 0 volts.

Inverter circuit 77 comprises a PNP junction transistor 63 having an emitter electrode **63*e*, a base electrode 63*b*, and a collector electrode 63*c*. Base 63*b* is connected through a coupling resistor 64 and a parallel capacitor 65 to an input terminal 66 connected through a wire 67 to output terminal 61 of the trigger 76. In the case of inverter 78, input terminal 66 is connected through a wire 75 to output terminal 62 of trigger 76**.

Emitter electrode **63*e* is connected to ground. Base electrode 63*b* is also connected through a biasing resistor 68 and a battery 69 to ground. Collector electrode 63*c* is connected through a load resistor 70 and the battery 71 to ground. A clamping circuit is provided for collector 63*c* including a diode 72 and a clamping battery 73. Collector 63*c* is also connected to an output terminal 74**.

The inverter circuit 77 operates to change the output pulses from trigger 76, which are positive pulses, to negative pulses. In other words, the inverter transistor 63 is On when no signal (−5 volts) is received from trigger terminal 61, and is cut off when a signal (0 volts) is received from that trigger. The inverters operate as power amplifiers and serve to lighten the load on trigger 76, thereby increasing the voltage range of the signal potentials at the ring circuit input.

While the transistors in the circuit illustrated are PNP junction transistors, it will be readily understood that NPN transistors can be used alternatively, providing that all the polarities of the batteries are reversed, and other changes made in accordance with principles well understood in the art.

The following table shows by way of example particular values for the potentials of the various batteries and for the impedances of the various resistors and capacitors, in circuits which have been operated successfully. In some cases, the values are also shown in the drawing. These values are set forth by way of example only, and the invention is not limited to them nor to any of them. The diodes are considered to have substantially no impedance in their forward direction and substantially infinite impedance in the reverse direction.

*Table I*

| | | |
|---|---|---|
| Capacitor 7 | mmf | 680 |
| Resistor 11 | ohms | 3K |
| Battery 13 | volts | 15 |
| Resistor 14 | ohms | 240K |
| Battery 15 | volts | 15 |
| Resistor 16 | ohms | 240K |
| Resistor 18 | do | 3K |
| Capacitor 20 | mmf | 680 |
| Battery 27 | volts | 5 |
| Resistor 28 | ohms | 39K |
| Battery 29 | volts | 45 |
| Resistor 31 | ohms | 100K |
| Battery 32 | volts | 50 |
| Resistor 33 | ohms | 20K |
| Capacitor 34 | mmf | 680 |
| Resistor 35 | ohms | 20K |
| Capacitor 36 | mmf | 680 |

Values for the various circuit elements in the trigger circuit 76 will be found in the Henle et al., application, Serial No. 459,381, referred to above.

Values for the inverter circuits will be found in the Bruce and Henle application referred to above.

While I have shown and described a preferred embodiment of my invention, other modifications thereof will readily occur to those skilled in the art, and I therefore intend my invention to be limited only by the appended claims.

I claim:

1. A ring circuit, comprising a plurality of trigger stages, switchable between normal and alternate states, each stage including first and second transistors having input and output electrodes, a pair of cross-coupling means, each connecting the output electrode of one transistor to the input electrode of the other transistor, said cross-coupling means being effective when either transistor is On to hold the other transistor Off, said first transistor being normally On; means for transmitting input pulses to said stages, including signal source means and means connecting said signal source means to the output electrode of the first transistor of each stage, and means to block pulses from the signal source means unless said first transistor is Off, one of said cross-coupling means in each stage being effective when said first transistor is Off and a pulse is received from said signal source means to transmit said pulse to the input electrode of the second transistor, thereby turning said second transistor Off, whereupon the other of said cross-coupling means is effective to transmit a pulse from the output of the second transistor to the input of the first transistor, turning said first transistor On; first interstage coupling means connecting the output electrode of the first transistor of each stage to the input electrode of the first transistor of the succeeding stage; second interstage coupling means connecting the output electrode of the second transistor to the input electrode of the second transistor of the succeeding stage, said first and second coupling means cooperating when the transistors of one stage switch from their alternate state to their normal state, to transmit triggering impulses to the transistors of the next succeeding stage to switch said last-mentioned transistors from their normal state to their alternate state.

2. A ring circuit, comprising an even number of stages; each stage including first and second transistors having input and output electrodes, a pair of cross-coupling means, each connecting the output electrode of one transistor to the input electrode of the other transistor, said cross-coupling means being effective when either transistor is On to hold the other transistor Off, said first transistor being normally On; means for transmitting input pulses alternately to the odd and even stages, said transmitting means including a pair of alternately transmitting signal sources, and means connecting the output of one of said sources to the output electrodes of the first transistors of the odd stages, means connecting the output of the other signal source to the output electrodes of the first transistors of the even stages, and means to block pulses from the signal source unless said first transistor is Off, one of said cross-coupling means in each stage being effective when said first transistor is Off and a pulse is received from its associated signal source to transmit said pulse to the input electrode of the second transistor, thereby turning said second transistor Off, whereupon the other of said cross-coupling means is effective to transmit a pulse from the output of the second transistor to the input of the first transistor, turning said first transistor On; first interstage coupling means connecting the output electrode of the first transistor to the input electrode of the first transistor of the succeeding stage; second interstage coupling means connecting the output electrode of the second transistor to the input electrode of the second transistor of the succeeding stage, said first and second coupling means cooperating when said first and second transistors of one stage switch from their Off and On conditions, respectively, to their normal On and Off conditions, to transmit triggering impulses to the first and second transistors of the next succeeding stage, said impulses being effective to turn said last-mentioned first and second transistors Off and On, respectively.

3. A ring circuit, comprising a plurality of trigger stages switchable between normal and alternate states, each stage including first and second transistors having input and output electrodes, a pair of cross-coupling means, each connecting the output electrode of one transistor to the input electrode of the other transistor, said cross-coupling means being effective when either transistor is On to hold the other transistor Off, said first transistor being normally On; means for transmitting input pulses to said stages, including signal source means, means connecting said signal source means to the output electrode of the first transistor of each stage, and means to block pulses from the signal source means unless said first transistor is Off, one of said cross-coupling means in each stage being effective when said first transistor is Off and a pulse is received from said signal source means to transmit said pulse to the input electrode of the second transistor, thereby turning said second transistor Off, whereupon the other of said cross-coupling means is effective to transmit a pulse from the output of the second transistor to the input of the first transistor, turning said first transistor On; and coupling means from each stage to the following stage including means connecting the output electrode of the first transistor of each stage to the input electrode of the first transistor of the following stage, so that a signal reaching said output electrode of the first transistor is effective to initiate switching of both stages.

4. A ring circuit as defined in claim 3, in which each leading stage is effective to transmit a further signal through said first transistor coupling means to the following stage when the switching of the leading stage is completed.

5. A ring circuit, comprising a plurality of trigger stages switchable between normal and alternate states, each stage including first and second translating devices having input and output electrodes, a pair of cross-coupling means, each connecting the output electrode of one device to the input electrode of the other device, said cross-coupling means being effective when either device is On to hold the other device Off, said first device being normally On; means for transmitting input pulses to said stages, including signal source means, means connecting said signal source means to the output electrode of the first device of each stage, and means to block pulses from said signal source means unless said first device is Off, and interstage coupling means including means connecting the output electrode of the first device of each stage to the input electrode of the first device of the following stage, so that a signal reaching said output electrode of the first device in one stage is effective to initiate switching in both that stage and the following stage.

References Cited in the file of this patent

UNITED STATES PATENTS

| | | |
|---|---|---|
| 2,580,771 | Harper | Jan. 1, 1952 |
| 2,644,887 | Wolfe | July 7, 1953 |
| 2,673,936 | Harris | Mar. 30, 1954 |
| 2,700,750 | Dickinson | Jan. 25, 1955 |
| 2,773,983 | Baker et al. | Dec. 11, 1956 |
| 2,785,304 | Bruce et al. | Mar. 12, 1957 |
| 2,808,203 | Geyer et al. | Oct. 1, 1957 |